United States Patent [19]
Sasaki et al.

[11] Patent Number: 6,049,232
[45] Date of Patent: *Apr. 11, 2000

[54] SEMICONDUCTOR INTEGRATED CIRCUIT

[75] Inventors: Yasuhiko Sasaki, Koganei; Kazuo Yano, Hino; Shunzo Yamashita, Tokyo; Koichi Seki, Hino, all of Japan

[73] Assignee: Hitachi, Ltd., Tokyo, Japan

[*] Notice: This patent is subject to a terminal disclaimer.

[21] Appl. No.: 09/225,291

[22] Filed: Jan. 5, 1999

Related U.S. Application Data

[63] Continuation of application No. 08/633,053, Apr. 16, 1996.

[30] Foreign Application Priority Data

Apr. 25, 1995 [JP] Japan .................................... 7-099204

[51] Int. Cl.$^7$ .............................................. H03K 19/0948
[52] U.S. Cl. ............................................ 326/113; 326/121
[58] Field of Search ........................... 326/113–114, 112, 326/119, 121, 17, 83

[56] References Cited

U.S. PATENT DOCUMENTS

| | | |
|---|---|---|
| 4,477,904 | 10/1984 | Thorsrud . |
| 4,541,067 | 9/1985 | Whitaker . |
| 5,144,582 | 9/1992 | Steele . |
| 5,200,907 | 4/1993 | Tran . |
| 5,528,177 | 6/1996 | Sridhar et al. . |
| 5,581,202 | 12/1996 | Yano et al. . |
| 5,923,189 | 7/1999 | Sasaki et al. ............................ 326/113 |

FOREIGN PATENT DOCUMENTS

| | | |
|---|---|---|
| 1-216622 | 8/1989 | Japan . |
| 1-256219 | 10/1989 | Japan . |

OTHER PUBLICATIONS

IEEE Journal of Solid–State Circuits, vol. SC–22, No. 2, Apr. 1987, "CMOS Differential Pass–Transistor Logic Design", Pasternak et al, pp. 216–222.

IEEE Journal of Solid–State Circuits, vol. SC–25, No. 2, Apr. 1990, "A 3.8–ns CMOS 16×16–b Multiplier Using Complementary Pass–Transistor Logic", Yano et al, pp. 388–395.

IEEE 1994 Custom Integrated Circuits Conference, 1994 Digest, "Lean Integration: Achieving a Quantum Leap in Performance and Cost of Logic LSIs", Yano et al, pp. 603–306.

Proceedings of the 1994 Autumn Convention of the Institute of Electronics, Information and Communication Engineers of Japan, Edition of Fundamentals and Interfaces, p. 64.

IEEE Transactions on Computers, vol. C–35, No. 8, Aug. 1986, "Graph–Based Algorithms for Boolean Function Manipulation", R. Bryant, pp. 677,691.

Y. Sasaki et al, "Multi–Level Pass–Transistor Logic for Low–Power ULSIs", Digest of Technical Papers of IEEE 1995 Symposium on Low Power Electronics, 1995, pp. 14–15.

*Primary Examiner*—Jon Santamauro
*Attorney, Agent, or Firm*—Beall Law Offices

[57] ABSTRACT

For the relation between the first and second pass-transistor circuits (PT1, PT2), the output signal of the preceding-stage is supplied to the gate of the succeeding-stage, and for the relation between the second and third pass-transistor circuits (PT2, PT3), the output signal of the preceding-stage is supplied to the source-drain path of the succeeding-stage. The first pass-transistor circuit (PT1) receives on its first input node (In1) and second input node (In2) the first input signal and the second input signal that are logically independent from each other. This logic circuit requires a smaller number of transistors and is capable of reducing the power consumption and delay and accomplishing an intricate logic function.

7 Claims, 5 Drawing Sheets

SEMICONDUCTOR INTEGRATED CIRCUIT

This is a continuation application of U.S. Ser. No. 08/633,053, filed Apr. 16, 1996.

BACKGROUND OF THE INVENTION

The present invention relates to a semiconductor integrated circuit, and particularly to a semiconductor integrated circuit which can be used in general-purpose processors, signal processors, video processors and the like including logic circuits.

Among circuitries using pass-transistors, there have been introduced differential pass-transistor logics as described in IEEE Journal of Solid-state Circuits, Vol.SC-22, No.2, Apr.1987, pp.216–222 (will be called the first prior art) and complementary pass-transistor logics as described in IEEE Journal of Solid-state Circuits, Vol.SC-25, No.2, Apr.1990, pp.388–395 (will be called the second prior art). These circuitries are complementary logic circuits using both inverting and non-inverting logics.

Pass-transistor circuits using single-channel MOSFETs, instead of complementary MOSFETs, and a design scheme of pass-transistor circuits of the standard cell scheme are described in Custom Integrated Circuits Conference 1994 Digest, pp.603–606 (will be called the third prior art).

A configuration scheme of pass-transistor circuits based on a logic expression called a binary decision diagram is described in the Proceeding of 1994 Autumn Convention of The Institute of Electronics, Information and Communication Engineers of Japan, edition of fundamentals and interfaces, p.64 (will be called the fourth prior art).

A logical operation scheme based on the binary decision diagram is described in IEEE, Transaction on Computers, Vol.C-35, No.8.Aug.1986, pp.677–691 (will be called the fifth prior art).

Logic circuits for accomplishing logics of exclusive-OR circuits, full adders and the like based on a scheme of supplying an output signal of a preceding-stage complementary pass-transistor circuit to the gates of complementary MOSFETs of a succeeding-stage complementary transistor circuit are described in Japanese Laid-Open Patent Application No. 1-216622 (will be called the sixth prior art).

Logic circuits for accomplishing logics of exclusive-OR circuits, full adders and the like based on a scheme of supplying an output signal of a preceding-stage complementary pass-transistor circuit to the sources of complementary MOSFETs of a succeeding-stage complementary transistor circuit are described in Japanese Laid-Open Patent Application No. 1-256219 (will be called the seventh prior art).

A parity detection and generation circuit using exclusive-OR circuits based on a scheme of supplying an output signal of a preceding-stage complementary pass-transistor circuit to the gates of complementary MOSFETs of a succeeding-stage complementary transistor circuit and a scheme of supplying a output signal of another preceding-stage complementary pass-transistor circuit to the source of a complementary MOSFET of the succeeding-stage complementary transistor circuit are described in U.S. Pat. No. 4,477,904 (will be called the eighth prior art).

SUMMARY OF THE INVENTION

A pass-transistor circuit requires a smaller number of transistors as compared with a conventional CMOS logic circuit in accomplishing a same logic function, and accordingly the circuit is more suitable for reduced power consumption and delay. However, it is more difficult to synthesize logic circuits comprised of pass-transistor circuits, and therefore they have not been used for random logic circuits which require all logic functions.

The above-mentioned sixth prior art, which adopts a scheme of supplying an output signal of a preceding-stage complementary pass-transistor circuit to the gates of complementary MOSFETs of a succeeding-stage complementary transistor circuit, and the seventh prior art, which adopts a scheme of supplying the output signal of the preceding-stage complementary pass-transistor circuit to the sources of complementary MOSFETs of the succeeding-stage complementary transistor circuit, are both used for logic circuits for accomplishing logics of exclusive-OR circuits, full adders and the like. The sixth and seventh prior arts, however, do not disclose a method for using pass-transistor circuits for accomplishing all logic functions.

The above-mentioned eighth prior art, which adopts both a scheme of supplying an output signal of the preceding-stage complementary pass-transistor circuit to the gates of complementary MOSFETs of the succeeding-stage complementary transistor circuit and a scheme of supplying the output signal of another preceding-stage complementary pass-transistor circuit to the source of a complementary MOSFET of the succeeding-stage complementary transistor circuit, is applied to parity detection and generation circuits using exclusive-OR circuits. The eighth prior art, however, does not disclose a method for using pass-transistor circuits for accomplishing all logic functions.

It is necessary to accomplish intricate logic functions with a smaller number of transistors, if it is intended to provide pass-transistor circuits that can be used for a random logic circuit which requires all logic functions.

The study of the inventors of the present invention revealed that it is difficult for the eighth prior art to accomplish intricate logic functions with a smaller number of transistors, because two MOSFETs of a same conductivity type in the preceding-stage complementary pass-transistor circuit, which drives the gates or sources of complementary MOSFETs of the succeeding-stage pass-transistor circuit, are supplied on their sources with complementary logic signals (high and low).

Accordingly, an object of the present invention is to provide a semiconductor integrated circuit including pass-transistor circuits which require a smaller number of transistors, are suitable for reduction of the power consumption and delay and accomplish intricate logic functions.

In order to achieve the above objective, the semiconductor integrated circuit according to one mode for carrying out the present invention comprises a logic circuit which includes first, second and third pass-transistor circuits (PT1, PT2, PT3). Each pass-transistor circuit has a first input node (In1), a second input node (In2), an output node (Out), a first field effect transistor (will be termed "FET" hereinafter) (Q1) having its source-drain path coupled to the first input node (In1) and the output node (Out), and a second FET (Q2) having its source-drain path coupled to the second input node (In2) and the output node (Out). The first FET (Q1) of the second pass-transistor circuit (PT2) has its gate responding to a signal on the output node (Out) of the first pass-transistor circuit (PT1). At least one of the first FET (Q1) and second FET (Q2) of the third pass-transistor circuit (PT3) has its source-drain path coupled to one of the first input node (In1) and output node (Out) of the second pass-transistor circuit (PT2). The first input node (In1) and the second input node (In2) of the first pass-transistor circuit (PT1) are respectively supplied with an input signal and another input signal (B, GND) that are logically independent from each other. See FIGS. 1 and 2.

The semiconductor integrated circuit according to this mode for carrying out the present invention bases the logical decision of the logic circuit output signal, which is obtained on one of the output node of the second pass-transistor circuit and the output node of the third pass-transistor circuit, on (1) a scheme adopted between the first and second pass-transistor circuits, of supplying an output signal of a preceding-stage pass-transistor to a gate of a succeeding-stage pass-transistor, (2) a scheme adopted between the second and third pass-transistor circuits, of supplying an output signal of a preceding-stage pass-transistor to the source-drain path of a succeeding-stage pass-transistor, and (3) a scheme of supplying the input signals that are logically independent from each other to the first and second input nodes of the first pass-transistor circuit.

Thus, the output signal of the logic circuit which includes the first, second and third pass-transistor circuits on these three schemes of applying signals, and therefore, this semiconductor integrated circuit needs a smaller number of transistors and reduced the power consumption and delay and can accomplish intricate logic functions.

Furthermore, a semiconductor integrated circuit which is capable of accomplishing more intricate logic functions can be obtained by changing inter-connection among the first, second and third pass-transistor circuits or by adopting complicated schemes of supplying logical input signals to the first and second input nodes of these pass-transistor circuits.

In the semiconductor integrated circuit according to a specific mode for carrying out the present invention, at least one of the first FET (Q1) and second FET (Q2) of the third pass-transistor circuit (PT3) has its source-drain path coupled to the first input node (In1) of the second pass-transistor circuit (PT2). The first and second FETs (Q1, Q2) of the first pass-transistor circuit (PT1) have their gates responding to first complementary input signals (A, /A) and become conductive in a complementary fashion. The first and second FETs (Q1, Q2) of the second pass-transistor circuit (PT2) have their gates responding to second complementary input signals and become conductive in a complementary fashion. The first and second FETs (Q1, Q2) of the third pass-transistor circuit (PT3) have their gates responding to third complementary input signals (C, /C) and become conductive in a complementary fashion. The first pass-transistor circuit (PT1) produces on its output node (Out) a logical product signal (A·B) of the first complementary input signals (A, /A) and an input signal (B) received on its first input node (In1). The third pass-transistor circuit (PT3) produces on its output node (Out) a logical product signal (C·D) of the third complementary input signals (C, /C) and an input signal (D) received on its first input node (In1). The second pass-transistor circuit (PT2) is supplied with the second complementary input signals derived from the logical product signal (A·B) produced on the output node (Out) of the first pass-transistor circuit (PT1) and produces on its output node (Out) a synthesis signal (A·B·C·D) of a logical product of the logical product signal (A·B) on the output node (Out) of the first pass-transistor circuit (PT1) and the logical-product signal (C·D) on the output node (Out) of the third pass-transistor circuit (PT3). See in FIG. 1.

In a semiconductor integrated circuit according to another specific mode for carrying out the present invention, at least one of the first FET (Q1) and second FET (Q2) of the third pass-transistor circuit (PT3) has its source-drain path coupled to the output node (Out) of the second pass-transistor circuit (PT2). The first and second FETs (Q1, Q2) of the first pass-transistor circuit (PT1) have their gates responding to first complementary input signals (A, /A) and become conductive in a complementary fashion. The first and second FETs (Q1, Q2) of the second pass-transistor circuit (PT2) have their gates responding to second complementary input signals and become conductive in a complementary fashion. The first and second FETs (Q1, Q2) of the third pass-transistor circuit (PT3) have their gates responding to third complementary input signals (D, /D) and become conductive in a complementary fashion. The first pass-transistor circuit (PT1) produces on its output node (Out) a logical-product signal (A·B) of the first complementary input signals (A, /A) and a first input signal (B) received on its first input node (In1). The second pass-transistor circuit (PT2) is supplied with the second complementary input signals derived from the logical-product signal (A·B) produced on the output node (Out) of the first pass-transistor circuit (PT1) and produces on its output node (Out) a logical product signal (A·B·C) of the logical-product signal (A·B) and an input signal C received on its first input node (In1). The third pass-transistor circuit (PT3) is supplied on its first input node (In1) with the logical product signal (A·B·C) from the output node (Out) of the second pass-transistor circuit (PT2) and produces on its output node (Out) a synthesis signal (A·B·C·/D) of a logical product of the logical-product signal (A·B·C) provided from the output node (Out) of the second pass-transistor circuit (PT2) and the third complementary input signals (D, /D). See FIG. 2.

In a semiconductor integrated circuit according to a more specific mode for carrying out the present invention, the first and second FETs (Q1, Q2) of each of the first, second and third pass-transistor circuits (PT1, PT2, PT3) are n-channel MOSFETs. The logical-product signal (A·B) produced on the output node (Out) of the first pass-transistor circuit (PT1) is supplied to the inputs of CMOS inverters (4000, 4002, 4003, 4004) supplied. The second complementary input signals to be supplied to the second pass-transistor circuit (PT2) are produced from the outputs of the CMOS inverters (4000, 4002, 4003, 4004). See FIG. 4.

A semiconductor integrated circuit according to a most specific mode for carrying out the present invention comprises at least two logic circuits (LC1, LC2) having a circuit structure and a logic signal supplying scheme, both similar to those of the logic circuit mentioned above, and a synthesis logic circuit (LC12) which logically processes output signals of the logic circuits (LC1, LC2). See FIGS. 3 and 4.

Other objects and novel features of the present invention will be apparent from the following description of embodiments.

DESCRIPTION OF THE PREFERRED AND OTHER EMBODIMENTS

Embodiments of the present invention will be explained with reference to the drawings.

Figure 1:
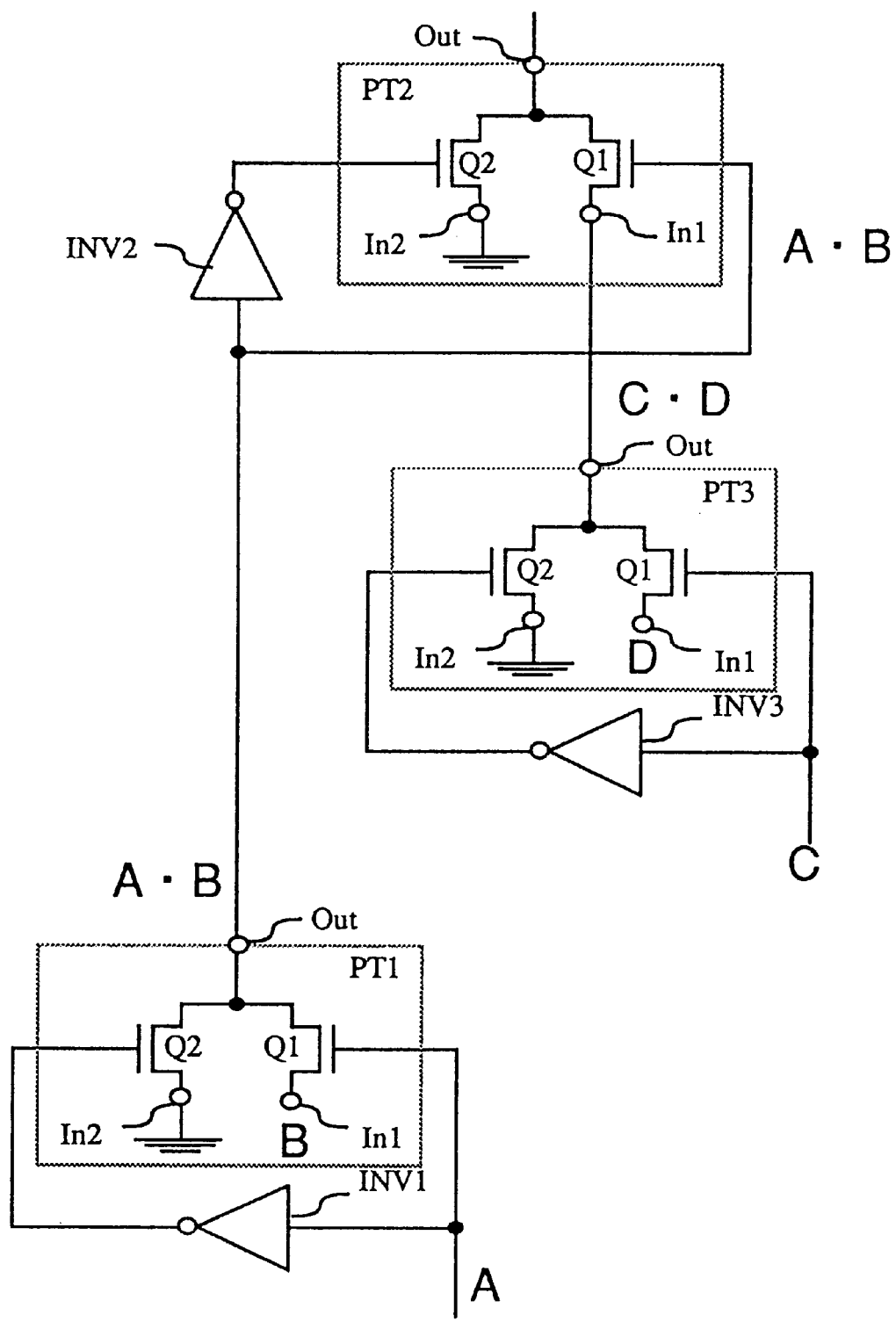
FIG. 1 is a schematic diagram of a logic circuit according to an embodiment of the present invention.
Figure 2:
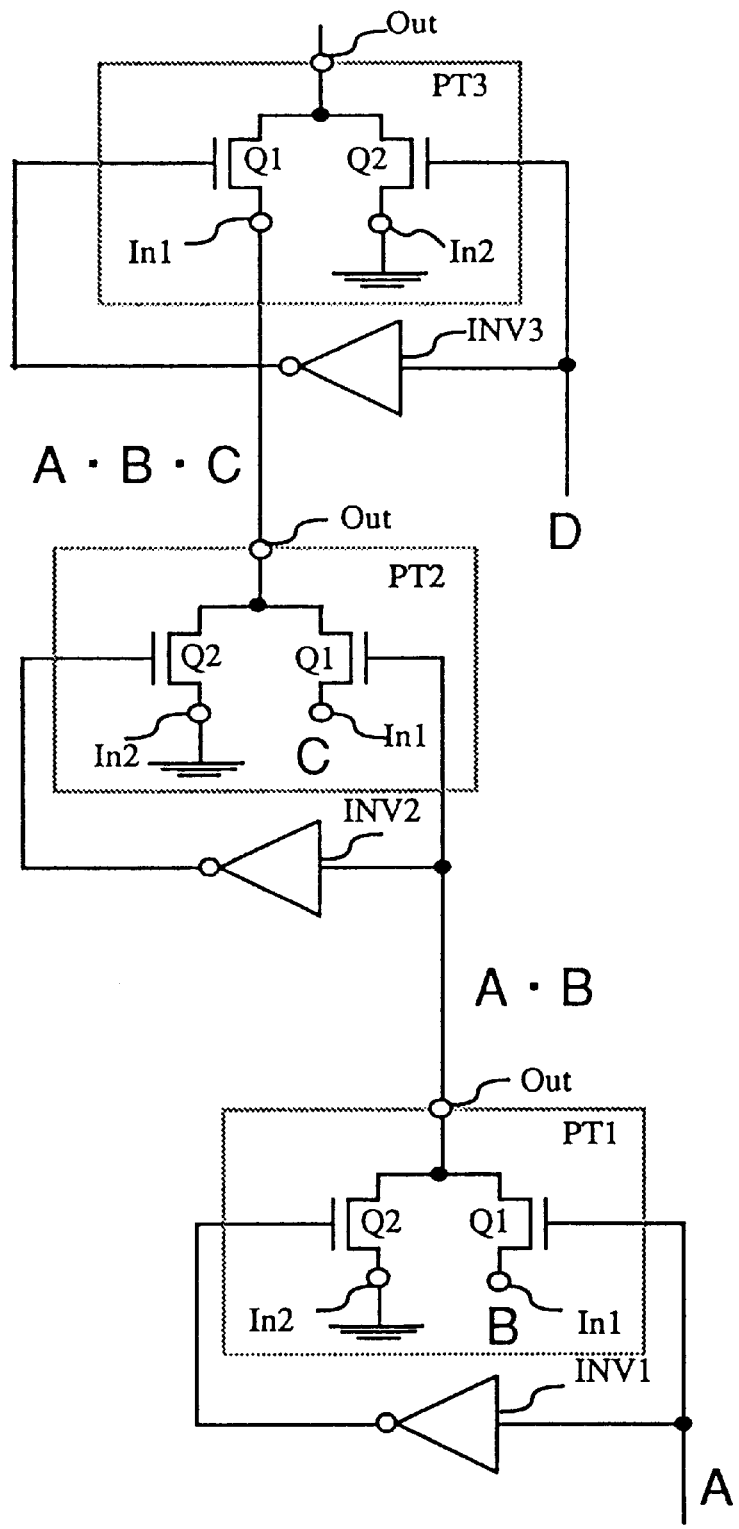
FIG. 2 is a schematic diagram of the logic circuit according to another embodiment of the present invention.

FIG. 1 and FIG. 2 show the schematic diagrams of semiconductor integrated circuits including logic circuits according to different embodiments of the present invention. Circuit elements are formed in a single monocrystalline silicon semiconductor substrate based on the known fabrication techniques of semiconductor integrated circuits.

The logic circuits of this semiconductor integrated circuit of these embodiments have first to third pass-transistor circuits (PT1, PT2, PT3).

Each pass-transistor circuit (PT1, PT2 or PT3) has a first input node (In1), a second input node (In2), an output node (Out), a first FET (Q1) having its source-drain path coupled to the first input node (In1) and the output node (Out), and a second FET (Q2) having its source-drain path coupled to the second input node (In2) and the output node (Out).

The first FET (Q1) of the second pass-transistor circuit (PT2) has its gate responding to the signal on the output node (Out) of the first pass-transistor circuit (PT1). At least one of the first FET (Q1) and second FET (Q2) of the third pass-transistor circuit (PT3) has its source-drain path coupled to one of the first input node (In1) and output node (Out) of the second pass-transistor circuit (PT2). The first input node (In1) and second input node (In2) of the first pass-transistor circuit (PT1) are supplied with first and second input signals (B, GND), respectively, that are logically independent from each other.

The first and second FETs (Q1, Q2) of each pass-transistor circuit (PT1, PT2 or PT3) are n-channel MOS-FETs.

CMOS inverter circuits (INV1, INV2, INV3) are coupled to the gates of the first and second FETs (Q1, Q2) of the first to third pass-transistor circuits (PT1, PT2, PT3), respectively.

In a modified embodiment, the second FETs (Q2) of the first and third pass-transistor circuits (PT1, PT2, PT3) may be replaced with p-channel MOSFETs. In this case, the CMOS inverter circuits (INV1, INV2, INV3) are eliminated, and the gates of the first and second FETs (Q1, Q2) of each pass-transistor circuit can be connected directly.

Next, the circuit structure and an operation of the logic circuit shown in FIG. 1 will be explained in more detail.

In the first pass-transistor circuit (PT1), the first n-channel FET (Q1) is supplied on its gate with a logical input signal A that has either a high or low level, and the second n-channel FET (Q2) is supplied on its gate with an inverted signal /A of the logical input signal A by way of the CMOS inverter circuit (INV1). The first input node (In1) is supplied with a logical input signal B that has either a high or low level, and the second input node (In2) is supplied with a fixed ground voltage (GND). Consequently, the first pass-transistor circuit (PT1) produces on its output node (Out) an output signal A·B that is the logical product of logical input signals A and B.

The logical output signal A·B of the first pass-transistor circuit (PT1) is delivered to the gate of the first FET (Q1) of the second pass-transistor circuit (PT2), which has the second FET (Q2) supplied on its gate with an inverted signal of A·B by way of the CMOS inverter circuit INV2.

In the third pass-transistor circuit (PT3), the first n-channel FET (Q1) is supplied on its gate with a logical input signal C that has either a high or low level, and the second n-channel FET (Q2) is supplied on its gate with an inverted signal /C of the logical input signal C by way of the CMOS inverter circuit (INV3). The first input node (In1) is supplied with a logical input signal D that has either a high or low level, and the second input node (In2) is supplied with a fixed ground voltage (GND). Consequently, the third pass-transistor circuit (PT3) produces on its output node (Out) an output signal C·D that is a logical product of the logical input signals C and D.

The logical output signal C·D of the third pass-transistor circuit (PT3) is delivered to the first input node (In1) of the second pass-transistor circuit (PT2), which has the first FET (Q1) supplied on its gate with the logical output signal A·B of the first pass-transistor circuit (PT1). Consequently, the second pass-transistor circuit (PT2) produces on its output node (Out) an output signal A·B·C·D that is a logical product of the logical input signals A, B, C and D.

Accordingly, the logic circuit which includes the first to third pass-transistor circuits (PT1, PT2, PT3) of the embodiment shown in FIG. 1 functions as a 4-input AND circuit. A multi-input AND circuit obviously has a role of basic logic functions for random logic circuits which require all logic functions, and therefore the logic circuit of this embodiment has very high practical advantage.

The logic circuit of this embodiment can readily be modified to accomplish more intricate logic functions. For example, the first pass-transistor circuit (PT1) is supplied on its second input node (In2) with a logical input signal X that has either a high or low level in place of the fixed ground voltage (GND). In this case, the first pass-transistor circuit (PT1) produces on its output node (Out) a signal A·B+/A·X that is a logical sum of a logical-product signal /A·X (a logical product of the inverted logical input signal /A and logical input signal X) and a logical-product signal A·B (a logical product of the logical input signals A and B). Finally, the second pass-transistor circuit (PT2) will produce obviously on its output node (Out) a very intricate logical output signal.

Now, the circuit structure and an operation of the logic circuit shown in FIG. 2 will be explained.

In the first pass-transistor circuit (PT1), the first n-channel FET (Q1) is supplied on its gate with a logical input signal A that has either a high or low level, and the second n-channel FET (Q2) is supplied on its gate with an inverted signal /A of the logical input signal A by way of the CMOS inverter circuit (INV1). The first input node (In1) is supplied with a logical input signal B that has either a high or low level, and the second input node (In2) is supplied with a fixed ground voltage (GND). Consequently, the first pass-transistor circuit (PT1) produces on its output node (Out) an output signal A·B that is a logical product of the logical input signals A and B.

The logical output signal A·B of the first pass-transistor circuit (PT1) is delivered to the gate of the first FET (Q1) of the second pass-transistor circuit (PT2), which has the second PET (Q2) supplied on its gate with an inverted signal of A·B by way of the CMOS inverter circuit (INV2). The second input node (In2) is supplied with a fixed ground voltage (GND). Consequently, the second pass-transistor circuit (PT2) produces on its output node (Out) an output signal A·B·C that is a logical product of the logical input signals A, B and C.

In the third pass-transistor circuit (PT3), the first input node (In1) is supplied with the logical output signal A·B·C from the output node (Out) of the second pass-transistor circuit (PT2), the first FET (Q1) is supplied on its gate with an inverted signal /D of a logical input signal D by way of the CMOS inverter circuit (INV3), the second FET (Q2) is supplied on its gate with the logical input signal D, and the second input node (In2) is supplied with a fixed ground voltage (GND). Consequently, the third pass-transistor circuit (PT3) produces on its output node (Out) an output signal A·B·C·/D that is a logical product of the logical input signals A, B and C and inverted logical input signal /D.

The logic circuit of this embodiment can readily be modified to accomplish more intricate logic functions. For example, the first to third pass-transistor circuits (PT1, PT2, PT3) are respectively supplied on their second input nodes (In2) with logical input signals X, Y and Z that have either a high or low level, in place of the fixed ground voltage (GND). In this case, the third pass-transistor circuit (PT3) will produce obviously on its output node (Out) a very intricate logical output signal.

According to the foregoing embodiments of the present invention, it becomes possible to accomplishing more intricate logic functions by changing mutual coupling form of the first to third pass-transistor circuits (PT1, PT2, PT3) and by complicating signal supplying schemes for supplying logical input signals to the first and second input nodes (In1, In2) of these pass-transistor circuits, while at the same time it is possible to reduce the number of transistors, power consumption and delay.

For determining the mutual coupling form of the first to third pass-transistor circuits and signal supplying schemes of logical input signals for these pass-transistor circuits, the binary decision diagram similar to that of the above-mentioned fourth prior art can be used.

Figure 5:
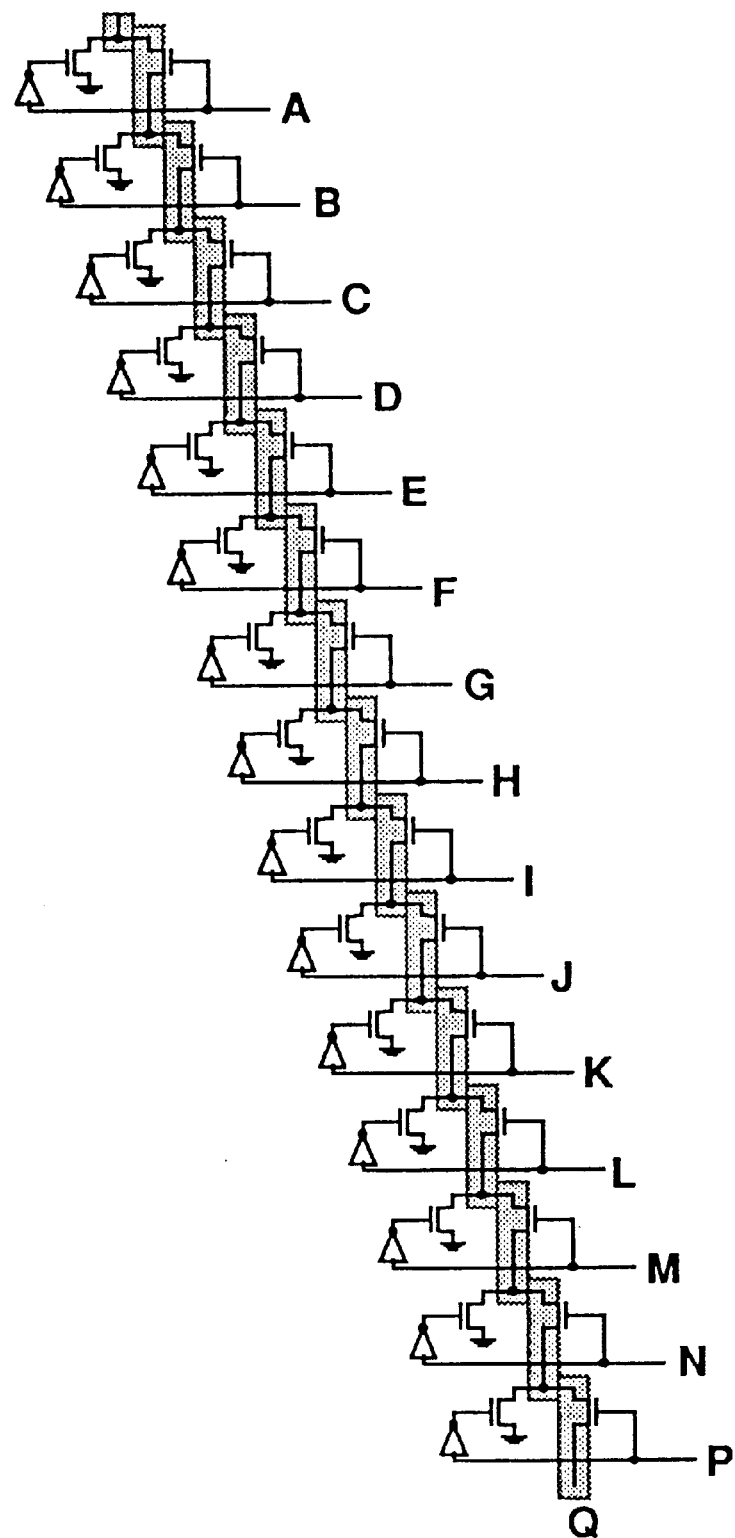
FIG. 5 is a schematic diagram of a 16-input AND circuit established by the inventors of the present invention.

FIG. 5 shows a 16-input AND circuit established by the inventors of the present invention based on serial connection of 15 pass-transistor circuits. Since the critical path from a logical input signal Q to the output OUT of this circuit arrangement is serial connection of 15 pass-transistor circuits, the AND circuit suffers a very large signal propagation delay.

Figure 3:
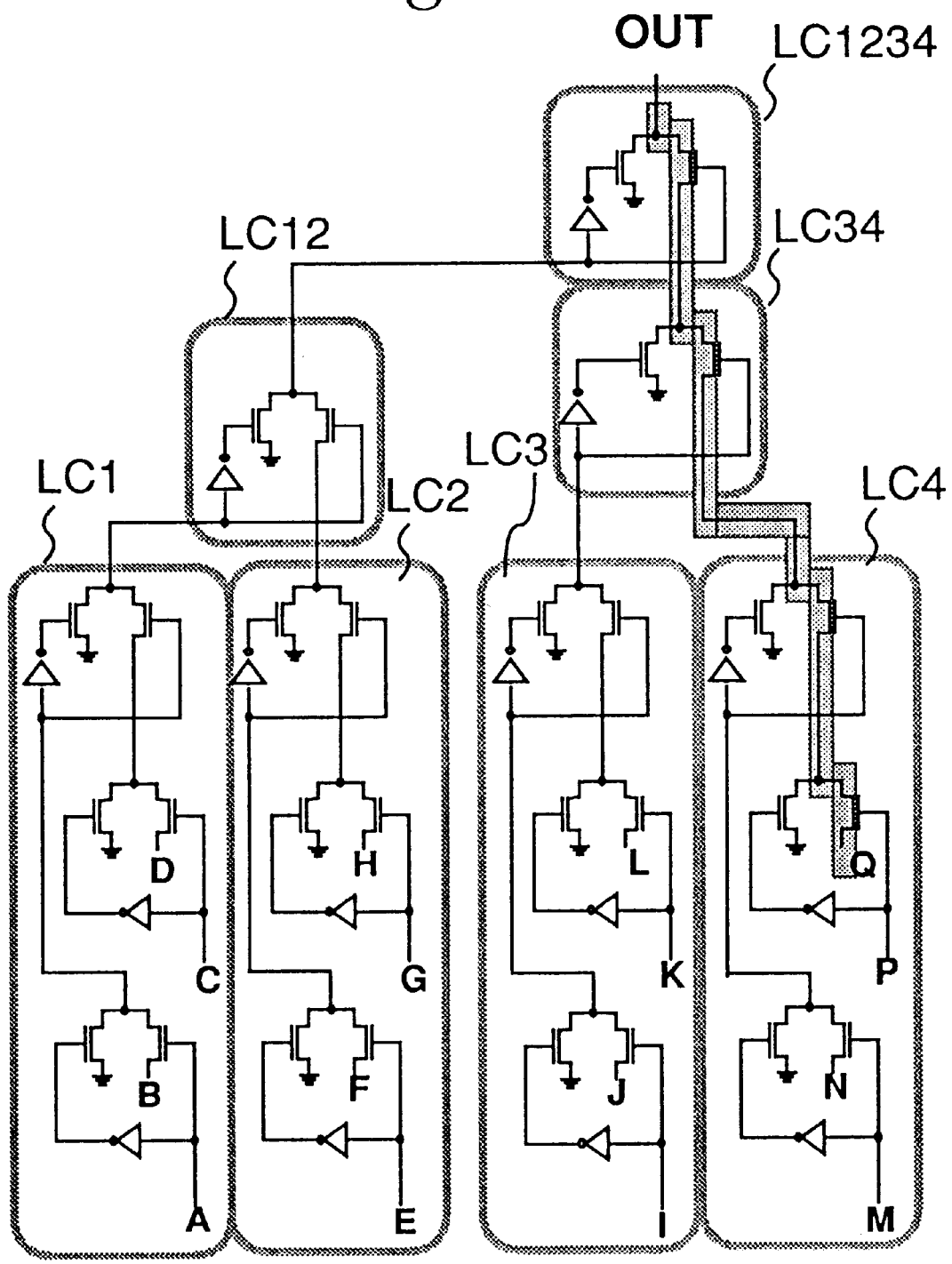
FIG. 3 is a schematic diagram of the 16-input AND circuit according to still another embodiment of the present invention.

FIG. 3 shows in contrast a 16-input AND circuit according to further another embodiment of the present invention, which reduces the signal propagation delay by application of the binary decision diagram. Each of logic circuit blocks (LC1, LC2, LC3 and LC4) has the same circuit structure as the logic circuit shown in FIG. 1. Accordingly, the logic circuit blocks (LC1, LC2, LC3 and LC4) produce a logical-product signal A·B·C·D, E·F·G·H, I·J·K·L and M·N·P·Q, respectively.

Logic circuit blocks (LC12 and LC34) produce logical-product signals A·B·C·D·E·F·G·H and I·J·K·L·M·N·P·Q, respectively, and finally a logic circuit block (LC1234) produces a logical-product signal A·B·C·D·E·F·G·H·I·J·K·L·M·N·P·Q. The critical path of the whole AND circuit is serial connection of four pass-transistor circuits, and the signal propagation delay can be reduced significantly.

Figure 4:
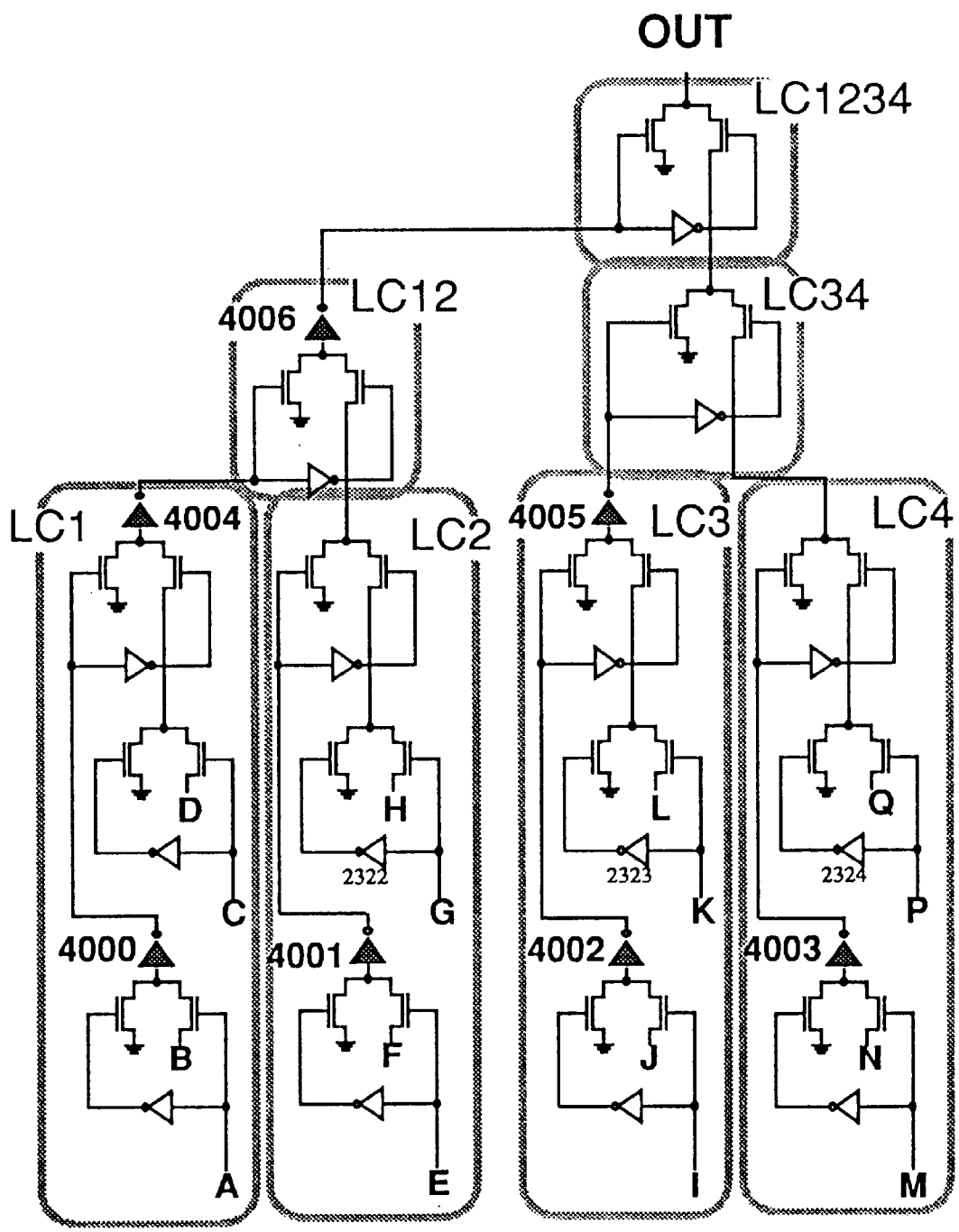
FIG. 4 is a schematic diagram of a 16-input AND circuit according to a variant embodiment of the present invention.

FIG. 4 shows a modified embodiment derived from the 16-input AND circuit of FIG. 3, which recovers a loss in a signal level which occurs during a signal passes through the pass-transistor circuits, by modifying the circuit structure and connection of the embodiment shown in FIG. 3.

It is known that a signal that passes through a pass-transistor circuit formed solely of n-channel MOSFETs suffers a loss of a threshold voltage between the gate-source voltage of the n-channel MOSFETs. In FIG. 4, CMOS inverters (4000, 4001, 4002, 4003, 4004, 4005 and 4006), included in the logic circuit blocks (LC1, LC2, LC3 and LC4) as amplifiers, recovers the loss of the threshold voltage. Based on this circuit arrangement, each CMOS inverter produces a correct low-level signal even if its high-level input signal has a slightly lower voltage level. The signal supplying scheme of a signal to the gates of the output pass-transistor circuits of the logic circuit blocks (LC1, LC2, LC3, LC4) has been modified, because the CMOS inverters (4000–4006) inverts logical inputs. Also, the signal supplying scheme of a signal to the gates of the pass transistor circuits in the logic circuit diagram (LC12, LC34, LC1234) has been modified. It is clear that the logic circuit block LC1234 produces a logical-product signal A·B·C·D·E·F·G·H·I·J·K·L·M·N·P·Q.

While there have been described various embodiments of the present invention, the present invention is not confined to these specific embodiments, but changes and modifications may be made obviously within the scope of its technical idea.

For example, the field effect transistors used in the pass-transistor circuits are not confined to MOSFETs, but MESFETs formed of compound semiconductor of GaAs can also be used. Logic circuits including the inventive pass-transistor circuits of the present invention can obviously be applied to, for example, a random logic circuit which controls an instruction execution unit by analyzing RISC-type instructions in an LSI such as a general-purpose processor, a signal processor or a video processor, thereby reducing the power consumption and delay of the whole LSI circuit.

The present invention offers a semiconductor integrated circuit including pass-transistor circuits which requires a smaller number of transistors and are capable of reducing the power consumption and delay and accomplishing an intricate logic function.

What is claimed is:

1. A semiconductor integrated circuit comprising:
   a logic circuit which includes first to third pass-transistor circuits,
   wherein each of said first to third pass-transistor circuits has,
   a first input node,
   a second input node,
   an output node,
   a first field effect transistor having its source-drain path coupled to the first input node and the output node, and
   a second field effect transistor having its source-drain path coupled to the second input node and the output node,
   wherein the first field effect transistor of said second pass-transistor circuit has its gate responding to a signal provided on the output node of said first pass-transistor circuit,
   wherein each of the first field effect transistor and second field effect transistor of said third pass-transistor circuit has its source-drain path coupled to the first input node of said second pass-transistor circuit,
   wherein an input signal supplied to each of the first and second input nodes of each of the first to third pass-transistor circuits is logically variable,
   wherein the first input node and the second input node of said first pass-transistor circuit are respectively supplied with an input signal and another input signal, that are logically independent from each other,
   wherein the first and second field effect transistors of said first pass-transistor circuit have their gates responding to first complementary input signals and become conductive in a complementary fashion, wherein the first and second field effect transistors of said second pass-transistor circuit have their gates responding to second complementary input signals and become conductive in a complementary fashion, said second complementary input signals comprising a signal in phase with a signal provided on said output node of said first pass-transistor circuit and a signal complementary thereto, and wherein the first and second field effect transistors of said third pass-transistor circuit have their gates responding to third complementary input signals and become conductive in a complementary fashion, wherein each of said first, second and third pass-transistor circuits is an n-channel MOSFET pass-transistor circuit in which said first and second field effect transistors of each of said first, second and third pass-transistor circuits of said logic circuit are n-channel MOSFETs and no p-channel MOSFET is connected in parallel to said first and second field effect transistors, and further comprising an amplifier circuit provided between the output node of the first pass-transistor circuit and the gate of the first field effect transistor of the second pass-transistor circuit, wherein said amplifier circuit amplifies both of said second complementary input signals.

2. A semiconductor integrated circuit according to claim 1, wherein said amplifier circuit comprises an inverter circuit.

3. A semiconductor integrated circuit comprising;

a logic circuit which includes first to third pass-transistor circuits, wherein each of said first to third pass-transistor circuits has, a first input node, a second input node, an output node, a first field effect transistor having its source-drain path coupled to the first input node and the output node, and a second field effect transistor having its source-drain path coupled to the second input node and the output node, wherein the first field effect transistor of said second pass-transistor circuit has its gate connected to the output node of said first pass-transistor circuit, wherein each of the first field effect transistor and second field effect transistor of said third pass-transistor circuit has its source-drain path coupled to the first input node of said second pass-transistor circuit, wherein the first input node and the second input node of said first pass-transistor circuit are respectively supplied with an input signal and another input signal, that are logically independent from each other, wherein the first and second field effect transistors of said first pass-transistor circuit have their gates responding to first complementary input signals and become conductive in a complementary fashion, wherein the first and second field effect transistors of said second pass-transistor circuit have their gates responding to second complementary input signals and become conductive in a complementary fashion, said second complementary input signals comprising a signal in phase with the signal provided on said output node of said first pass-transistor circuit and a signal complementary thereto, wherein the first and second field effect transistors of said third pass-transistor circuit have their gates responding to third complementary input signals and become conductive in a complementary fashion, wherein each of said first, second and third pass-transistor circuits is an n-channel MOSFET pass-transistor circuit in which said first and second field effect transistors of each of said first, second and third pass-transistor circuits of said logic circuit are n-channel MOSFETs and no p-channel MOSFET is connected in parallel to said first and second field effect transistors, and further comprising an amplifier circuit provided between the output node of the first pass-transistor circuit and the gate of the first field effect transistor of the second pass-transistor circuit, wherein said amplifier circuit amplifies both of said second complementary input signals.

4. A semiconductor integrated circuit according to claim 3, wherein said logic circuit further includes fourth to seventh pass-transistor circuits, wherein each of said fourth to seventh pass-transistor circuits has, a first input node, a second input node, an output node, a first field effect transistor having its source-drain path coupled to the first input node and the output node, and a second field effect transistor having its source-drain path coupled to the second input node and the output node, wherein the first field effect transistor of said first pass-transistor circuit has its gate connected to the output node of said fourth pass-transistor circuit, wherein each of the first field effect transistor and second field effect transistor of said fifth pass-transistor circuit has its source-drain path coupled to the first input node of said first pass-transistor circuit, wherein the first field effect transistor of said third pass-transistor circuit has its gate connected to the output node of said sixth pass-transistor circuit, wherein each of the first field effect transistor and second field effect transistor of said seventh pass-transistor circuit has its source-drain path coupled to the first input node of said third pass-transistor circuit, wherein the first and second field effect transistors of each of said fourth to seventh pass-transistor circuits have their gates responding to corresponding complementary input signals and become conductive in a complementary fashion, wherein the first and second field effect transistors of said first pass-transistor circuit have their gates responding to complementary input signals and become conductive in a complementary fashion, said complementary input signals comprising a signal in phase with the signal provided on said output node of said fourth pass-transistor circuit and a signal complementary thereto, wherein the first and second field effect transistors of said third pass-transistor circuit have their gates responding to complementary input signals and become conductive in a complementary fashion, said complementary input signals comprising a signal in phase with the signal provided on said output node of said sixth pass-transistor circuit and a signal complementary thereto, wherein each of said first, second and third pass-transistor circuit is an n-channel MOSFET pass-transistor circuit in which said first and second field effect transistors of each of said fourth to seventh pass-transistor circuits of said logic circuit are n-channel MOSFETs and no p-channel MOSFET is connected in parallel to said first and second field effect transistors, and further comprising another amplifier circuit and further another amplifier circuit, wherein said another amplifier circuit is one provided between the output node of the fourth pass-transistor circuit and the gate of the first field effect transistor of the first pass-transistor circuit, wherein said further another amplifier circuit is one provided between the output node of the sixth pass-transistor circuit and the gate of the first field effect transistor of the third pass-transistor circuit, for supplying an amplified non-inverted signal of the signal provided on the output node of the sixth pass-transistor circuit.

5. A semiconductor integrated circuit, comprising:

a logic circuit which includes first to third pass-transistor circuits, wherein each of said first to third pass-transistor circuits has, a first input node, a second input node, an output node, a first field effect transistor having its source-drain path coupled to the first input node and the output node, and a second field effect transistor having its source-drain path coupled to the second input node and the output node, wherein the first field effect transistor of said second pass-transistor circuit has its gate responding to a signal provided on the output node of said first pass-transistor circuit, wherein at least one of the first field effect transistor and second field effect transistor of said third pass-transistor circuit has its source-drain path coupled to the first input node of said second pass-transistor circuit, wherein the first input node and the second input node of said first pass-transistor circuit are respectively supplied with an input signal and another input signal, that are logically independent from each other;

wherein said logic circuit further includes at least one fourth pass-transistor circuit, wherein said fourth pass-transistor circuit has, a first input node, a second input node, an output node, a first field effect transistor having its source-drain path coupled to the first input node and the output node, and a second field effect transistor having its source-drain path coupled to the second input node and the output node, wherein the first field effect transistor of said third pass-transistor circuit has its gate connected to the output node of said fourth pass-transistor circuit, wherein an input signal supplied to each of the first and second input nodes of the fourth pass-transistor circuit and the gates of the first and second field effect transistors is logically variable, wherein the first and second field effect transistors of said fourth pass-transistor circuit have their gates responding to fourth complementary input signals and become conductive in a complementary fashion;

wherein each of said first, second and third pass-transistor circuits is an n-channel MOSFET pass-transistor circuit in which said first and second field effect transistors of each of said first, second and third pass-transistor circuits of said logic circuit are n-channel MOSFETs and no p-channel MOSFET is connected in parallel to said first and second field effect transistors, and further comprising an amplifier circuit provided between the output node of the first pass-transistor circuit and the gate of the first field effect transistor of the second pass-transistor circuit, wherein said amplifier circuit amplifies both of said second complementary input signals.

6. A semiconductor integrated circuit according to claim 5, wherein said amplifier circuit comprises an inverter circuit.

7. A semiconductor integrated circuit, comprising:

a logic circuit which includes first to third pass-transistor circuits, wherein each of said first to third pass-transistor circuits has, a first input node, a second input node, an output node, a first field effect transistor having its source-drain path coupled to the first input node and the output node, and a second field effect transistor having its source-drain path coupled to the second input node and the output node, wherein the first field effect transistor of said second pass-transistor circuit has its gate responding to a signal provided on the output node of said first pass-transistor circuit, wherein at least one of the first field effect transistor and second field effect transistor of said third pass-transistor circuit has its source-drain path coupled to the first input node of said second pass-transistor circuit, wherein the first input node and the second input node of said first pass-transistor circuit are respectively supplied with an input signal and another input signal, that are logically independent from each other;

wherein said logic circuit further includes at least one fourth pass-transistor circuit, wherein said fourth pass-transistor circuit has, a first input node, a second input node, an output node, a first field effect transistor having its source-drain path coupled to the first input node and the output node, and a second field effect transistor having its source-drain path coupled to the second input node and the output node, wherein the first field effect transistor of said third pass-transistor circuit has its gate connected to the output node of said fourth pass-transistor circuit, wherein an input signal supplied to each of the first and second input nodes of the fourth pass-transistor circuit and the gates of the first and second field effect transistors is logically variable, wherein the first and second field effect transistors of said fourth pass-transistor circuit have their gates responding to fourth complementary input signals and become conductive in a complementary fashion;

further comprising an amplifier circuit provided between the output node of the first pass-transistor circuit and the gate of the first field effect transistor of the second pass-transistor circuit, wherein said amplifier circuit amplifies both of said second complementary input signals.

* * * * *